(12) United States Patent
Lang

(10) Patent No.: US 9,787,934 B2
(45) Date of Patent: Oct. 10, 2017

(54) WIRELESS DEVICES WITH TOUCH SENSORS AND SOLAR CELLS

(71) Applicant: Apple Inc., Cupertino, CA (US)

(72) Inventor: Matthew E. Lang, Stratford, CA (US)

(73) Assignee: Apple Inc., Cupertino, CA (US)

( * ) Notice: Subject to any disclaimer, the term of this patent is extended or adjusted under 35 U.S.C. 154(b) by 177 days.

(21) Appl. No.: 14/155,741

(22) Filed: Jan. 15, 2014

(65) Prior Publication Data

US 2015/0199062 A1 Jul. 16, 2015

(51) Int. Cl.
*G06F 3/041* (2006.01)
*H04N 5/44* (2011.01)
(Continued)

(52) U.S. Cl.
CPC ............ *H04N 5/4403* (2013.01); *G06F 1/26* (2013.01); *G06F 3/03543* (2013.01); *G06F 3/03547* (2013.01); *G06F 3/044* (2013.01); *H01L 31/02167* (2013.01); *H02S 40/38* (2014.12); *H04N 5/63* (2013.01);
(Continued)

(58) Field of Classification Search
CPC .... G06F 3/03547; G06F 3/041; G06F 3/0412; G06F 3/0416; G06F 3/044; G06F 2203/04103; G06F 1/1635; H01L 31/00–31/078; Y02E 10/50–10/549; G02F 2201/13324; H01H 2219/011
See application file for complete search history.

(56) References Cited

U.S. PATENT DOCUMENTS 4,567,480 A * 1/1986 Blanchard ............. G06F 3/0421
178/18.09
5,327,160 A * 7/1994 Asher ..................... H03J 9/06
345/156

(Continued)

FOREIGN PATENT DOCUMENTS

CN 202145301 U * 2/2012
WO 2010093648 8/2010

OTHER PUBLICATIONS

Hirschmann, "Cleaner and Greener Cities with Integrated Transparent Solar Cells" ICFO—The Institute of Photonic Sciences, Eureka Alert, [online] AAAS the Science Society, Oct. 21, 2013, [retreived on Dec. 18, 2013] <URL: http://www.eurekalert.org/pub_releases/2013-10/iiop-cag102113.php>.

*Primary Examiner* — Amr Awad
*Assistant Examiner* — Roberto Flores
(74) *Attorney, Agent, or Firm* — Kilpatrick Townsend & Stockton, LLP

(57) ABSTRACT

A wireless input-output device may gather touch input from a user. The touch input may be wirelessly transmitted to external wireless equipment such as a computer. The wireless device has a touch sensor and a solar cell that converts ambient light into electrical power. Wireless communications circuitry transmits the touch input to the external equipment using the electrical power from the solar cell. Energy storage devices such as a capacitor and a battery can be charged using the electrical power. The wireless device may have a transparent cover layer. The touch sensor may be a transparent touch sensor that is located between the cover layer and the solar cell or the solar cell may be a transparent solar cell that is located between the transparent cover layer and the touch sensor.

9 Claims, 18 Drawing Sheets

(51) Int. Cl.
*G06F 3/044* (2006.01)
*G06F 3/0354* (2013.01)
*H04N 5/63* (2006.01)
*H04N 21/422* (2011.01)
*H01L 31/0216* (2014.01)
*H02S 40/38* (2014.01)
*G06F 1/26* (2006.01)

(52) U.S. Cl.
CPC ............ *H04N 21/42224* (2013.01); *G06F 2203/04105* (2013.01); *H04N 2005/443* (2013.01); *Y02E 10/50* (2013.01)

(56) References Cited

U.S. PATENT DOCUMENTS

| | | | | |
|---|---|---|---|---|
| 5,972,240 | A * | 10/1999 | Kobayashi | C09K 19/12 252/299.01 |
| 8,933,341 | B2 * | 1/2015 | Lin | H01L 31/0488 174/255 |
| 2004/0017362 | A1 * | 1/2004 | Mulligan | G06F 3/0488 345/173 |
| 2006/0097991 | A1 * | 5/2006 | Hotelling | G06F 3/0416 345/173 |
| 2006/0202925 | A1 * | 9/2006 | Manning | G02F 1/13476 345/87 |
| 2006/0278267 | A1 * | 12/2006 | Miyazawa | H01G 9/2004 136/252 |
| 2008/0094025 | A1 * | 4/2008 | Rosenblatt | G06F 1/1616 320/101 |
| 2009/0032720 | A1 * | 2/2009 | Atkinson | H01L 31/09 250/393 |
| 2009/0219273 | A1 * | 9/2009 | Nathan | H01L 27/3227 345/211 |
| 2009/0295943 | A1 * | 12/2009 | Kim | H04N 5/217 348/231.99 |
| 2009/0295976 | A1 * | 12/2009 | Choi | H04N 5/23293 348/333.11 |
| 2010/0078230 | A1 * | 4/2010 | Rosenblatt | G06F 3/041 178/18.01 |
| 2010/0079387 | A1 * | 4/2010 | Rosenblatt | G06F 1/1626 345/173 |
| 2010/0155575 | A1 * | 6/2010 | Lundin | G06F 1/1626 250/206 |
| 2011/0039603 | A1 * | 2/2011 | Kim | G06F 1/1632 455/566 |
| 2011/0279399 | A1 * | 11/2011 | Anderson | G06F 3/041 345/174 |
| 2011/0298718 | A1 * | 12/2011 | Chang | G06F 3/0202 345/168 |
| 2011/0304486 | A1 * | 12/2011 | Kao | G06F 1/1616 341/22 |
| 2012/0010834 | A1 * | 1/2012 | Shiotani | H01L 27/14609 702/64 |
| 2013/0027341 | A1 | 1/2013 | Mastandrea | |
| 2013/0038565 | A1 | 2/2013 | Elloway et al. | |
| 2013/0084796 | A1 | 4/2013 | Kerr | |
| 2014/0019913 | A1 | 1/2014 | Newman et al. | |
| 2014/0125603 | A1 * | 5/2014 | Lin | H01L 31/02168 345/173 |
| 2014/0255899 | A1 * | 9/2014 | Poullain | G06F 1/1616 434/351 |
| 2015/0130745 | A1 * | 5/2015 | Choi | G06F 3/044 345/174 |
| 2015/0138100 | A1 * | 5/2015 | Lin | G06F 1/26 345/173 |
| 2016/0068718 | A1 * | 3/2016 | Suwa | B32B 37/10 156/275.5 |

* cited by examiner

WIRELESS DEVICES WITH TOUCH SENSORS AND SOLAR CELLS

BACKGROUND

This relates generally to wireless devices for controlling electronic devices such as computers, and, more particularly, to wireless input-output devices with touch sensors.

Computers and other electronic devices are often controlled using input-output devices such as keyboards, mice, and track pads. These devices are often provided with wireless circuitry that allows the devices to be operated without being connected to a host by cable. The ability to wirelessly communicate with external equipment allows wireless input-output devices to be freely moved around by a user without worrying about cable length restrictions, cable tangles, and other inconveniences associated with using wired input-output devices.

Unfortunately, wireless input-output device are not able to receive power through a permanent wired connection. This creates a need for an alternate source of power. Disposable and rechargeable batteries are possible power sources for wireless input-output devices, but can be inconvenient to use. Rechargeable batteries use battery charging equipment that may be misplaced or may otherwise be inaccessible when batteries become depleted. Disposable batteries that have become depleted must be removed from the wireless input-output device and replaced with fresh disposable batteries, but fresh disposable batteries are not always available.

It would therefore be desirable to be able to provide improved wireless electronic devices such as wireless input-output devices for controlling external electronic equipment.

SUMMARY

A wireless input-output device may gather touch input from a user. The touch input may be wirelessly transmitted to external wireless equipment such as a computer. The wireless device may be a track pad, a touch sensitive computer mouse, a keyboard with an integrated trace pad, or other wireless accessory.

The wireless device may have a touch sensor that gathers user touch input and a solar cell that converts ambient light into electrical power. Wireless communications circuitry in the wireless device may transmit the touch input to the external equipment. A power regulator may be used to supply the electrical power from the solar cell to the wireless communications circuitry and to the touch sensor. Energy storage devices such as a capacitor and a battery may be used to store electrical energy using the electrical power from the solar cell.

The wireless device may have a transparent cover layer. The touch sensor may be a transparent touch sensor that is located between the cover layer and the solar cell or the solar cell may be a transparent solar cell that is located between the transparent cover layer and the touch sensor.

The touch sensor may have a shape such as a rectangular shape that is surrounded by a border region. The solar cell may overlap a touch sensor with this type of configuration or may be located in the border region.

DETAILED DESCRIPTION

Figure 1:
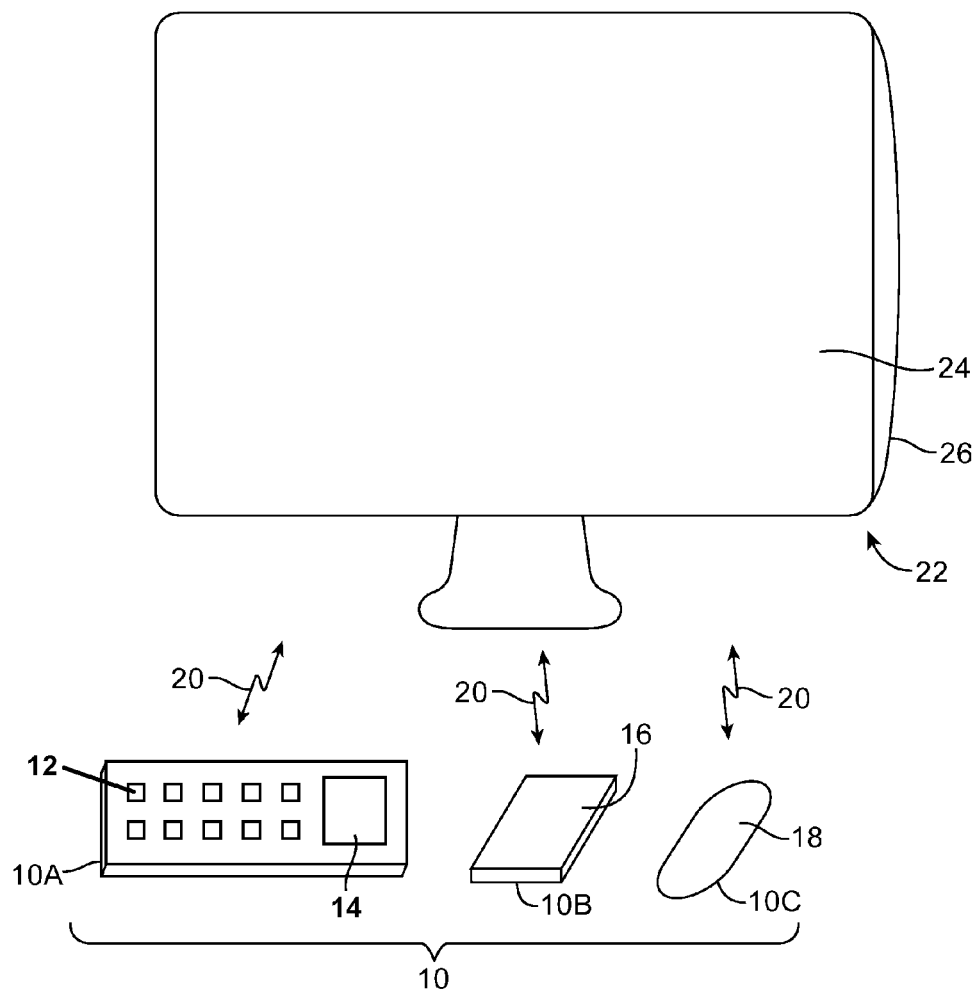
FIG. 1 is a diagram of illustrative wireless input-output devices that are wirelessly communicating with external electronic equipment in accordance with an embodiment.

Wireless input-output devices can be used to control electronic equipment such as set-top boxes, televisions, computers, portable electronic devices, or other host devices. An illustrative system environment in which wireless input-output devices are being used to control a host such as a computer or other external electronic equipment is shown in FIG. 1. As shown in FIG. 1, wireless input-output devices 10 may include wireless computer accessories such as wireless keyboard 10A, wireless track pad 10B, and wireless mouse 10C. Wireless keyboard 10A may have keys 12 and an integrated track pad such as track pad 14. Wireless track pad 10B may have a planar surface such as surface 16 that is used to gather touch input from a user. Portion 18 of wireless mouse 10C may be used to gather touch input from a user. Devices 10B and 10C may also have buttons or other components to receive user input.

Wireless links 20 may be used to support communications between wireless input-output devices 10 and external wireless electronic equipment such as wireless host device 22. Wireless links 20 may be low-energy Bluetooth® link, other short-range low power wireless links, or other wireless communications paths (e.g., wireless paths using radio-frequency transmissions associated with radio-frequency transceivers, ultrasonic sound transmissions, light transmissions, or other transmissions that do not require cabling between devices 10 and device 22).

Host device 22 may have a housing such as housing 26 in which display 24 is mounted or may be implemented without a display (e.g., in a set-top box configuration). Host 22 may be controlled using user input from input-output devices 10. For example, a user may use one or more of devices 10 to gather user touch input that positions a cursor on device 22, to gather multi-touch gesture input, to click on a desired on-screen option being presented to a user on display 24, or may otherwise use devices 10 to supply user input to host 22. The user input that is wirelessly transmitted to host 22 preferably includes user touch input gathered with a touch sensor in device 10. Host 22 may optionally supply output to a user through wireless devices 10. For example, host 22 may transmit information to devices 10 that devices 10 display using status-indicator lights or other output structures.

Figure 2:
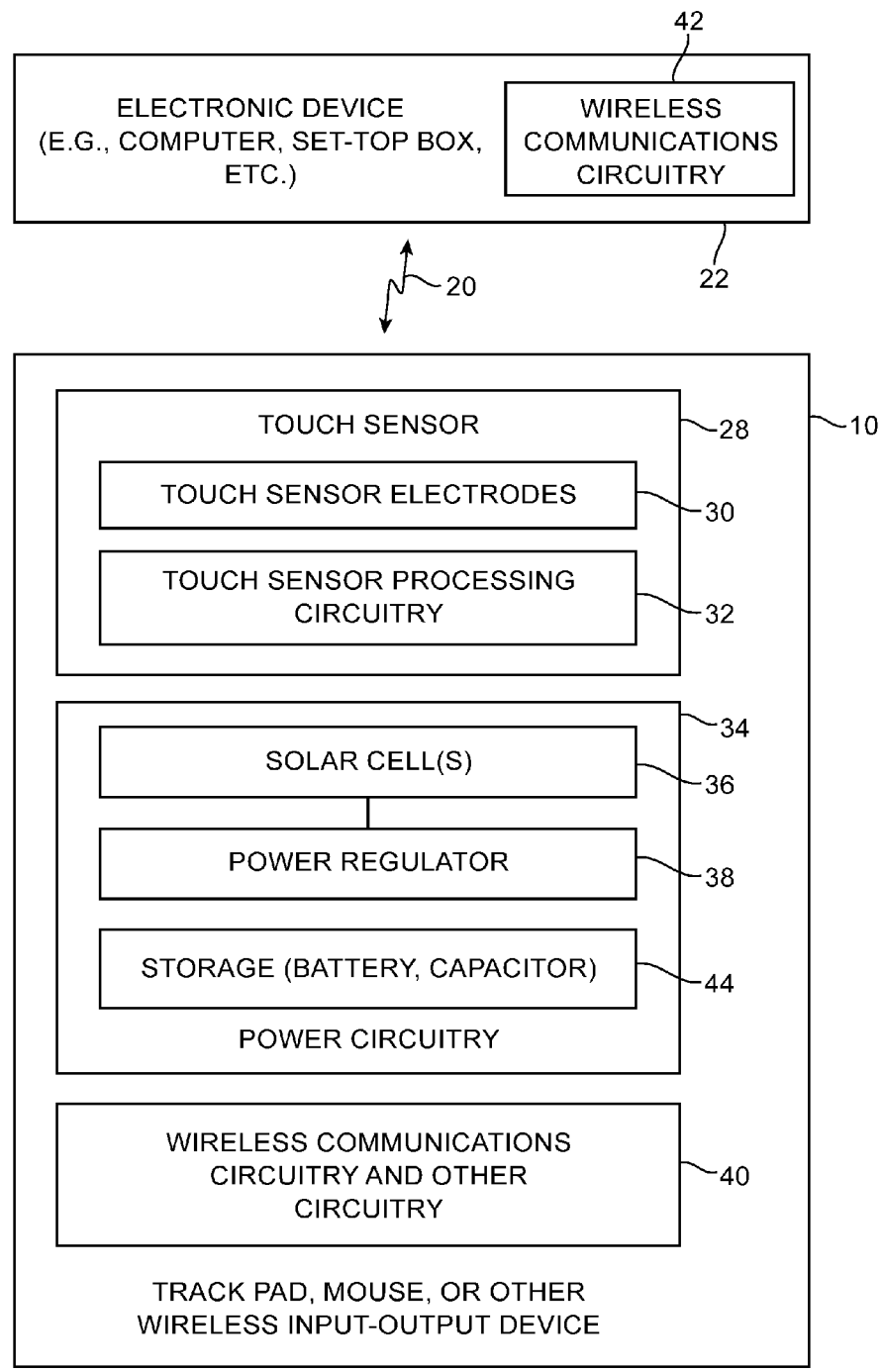
FIG. 2 is a schematic diagram of an illustrative system having equipment that is controlled using one or more associated wireless input-output devices in accordance with an embodiment.

A schematic diagram of the equipment of FIG. 1 is shown in FIG. 2. As shown in FIG. 2, wireless external electronic equipment such as host 22 may have wireless communications circuitry 42. Electronic input-output device 10 may have wireless communications circuitry 40. Wireless radio-frequency transceiver circuitry such as wireless communications circuitry 40 and 42 may be used to support communications over wireless link 20. The communications may be unidirectional between device 10 and device 22 or may be bidirectional.

Device 10 may have touch sensor functionality and light-based power generation capabilities. For example, device 10 may have a touch sensor such as touch sensor 28 and light-based power circuitry 34. Light-based power circuitry 34 may convert light that is incident on device 10 into electrical power for powering the circuitry of device 10. Touch sensor 28 may be used for gathering user touch input from a user.

Touch sensor 28 may include touch sensor electrodes such as touch sensor electrodes 30. Touch sensor electrodes 30 may be capacitive touch sensor electrodes for capacitive touch sensing. Touch sensor processing circuitry 32 may be used to supply drive signals to touch sensor electrodes 30 and to gather corresponding sense signals. Touch sensor processing circuitry 32 may process the signals associated with touch sensor electrodes 30 (e.g., drive signal and sense signal data) and may use this information to generate touch data. Touch sensor electrodes 30 may form an array across the surface of touch sensor 28. Touch sensor processing circuitry 32 may use the array of touch sensor electrodes 30 to gather lateral (X-Y) position information on the point or points of contact of an external object or objects (e.g., a stylus, one or more user fingertips, etc.) with sensor 28. Motion information representing how an external object moves across the surface of the touch sensor array may also be gathered by touch sensor 28. User touch input that is gathered by touch sensor 28 may include information on where a user's finger or other external object clicks (presses down) on the touch sensor, location data (i.e., information on where the user's finger(s) or other external object touches the touch sensor), and touch gesture information (e.g., information on finger swipes, information on multitouch gestures such as pinch-to-zoom gestures, information on multi-finger swipe gestures, and other touch input involving the motion of one or more fingers or other external objects across the touch sensor). If desired, non-capacitive touch sensor technology may be used in touch sensor 28. For example, touch sensor 28 may be implemented using acoustic touch technology, force-based touch sensor technology, resistive touch technology, etc. The use of a capacitive touch sensor for touch sensor 28 of device 10 in FIG. 2 is merely illustrative.

Power circuitry 34 may include a light-based source of power such as solar cell 36. Solar cell 36 (sometimes also referred to as a photovoltaic cell or light-based power source) may be based on inorganic semiconductors (e.g., crystalline silicon, polysilicon, amorphous silicon, cadmium telluride, gallium arsenide, etc.), organic semiconductors (e.g., polymers such as polyphenylene vinylene), or other suitable materials. During operation, solar cell 36 is exposed to ambient light and converts the ambient light to electrical power. The electrical power from solar cell 36 may be stored in one or more energy storage devices 44 such as a battery or capacitor. Power regulator 38 may be used in regulating the flow of power from solar cell 36 to energy storage circuitry 44 and in regulating the flow of power to the circuitry of device 10 from solar cell 36 and from energy storage devices 44. For example, power regulator 38 may provide electrical power from solar cell 36 to storage device 44 and/or other components in device 10 such as touch sensor 28 and wireless communications circuitry and other circuitry 40 and may be used in providing electrical power from storage device 44 to circuitry such as touch sensor 28 and wireless communications circuitry and other circuitry 40.

Wireless communications circuitry and other circuitry 40 in device 10 may be used to support wireless communications with external devices such as device 22 (e.g., by communicating with wireless communications circuitry 42 in device 22 over wireless link 20). Wireless communications circuitry 40 may, for example, transmit user touch input to external wireless equipment 22 using electrical power from solar cell 36 (i.e., electrical power provided to circuitry 40 using regulator 38). The wireless communications circuitry of device 10 and device 22 may include low-energy Bluetooth® transceiver circuitry and/or other short-range low power wireless circuitry (e.g., wireless local area network transceiver circuitry). Wireless communications circuitry 40 and 42 may also include cellular telephone circuitry or other longer range transceivers, if desired. In general, power consumption may be minimized by using low power wireless schemes such as by using wireless communications circuitry 40 that relies solely or primarily on short range low power transceiver circuits for communicating with a nearby host (i.e., for communicating with a computer that is within a 3 meters of device 10 or other suitable distance).

To control the operation of device 10, circuitry 40 may include control circuitry. The control circuitry may include storage and processing circuitry. The storage and processing circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in circuitry 40 may be used in controlling the operation of device 10. The processing circuitry may be based on one or more microprocessors, microcontrollers, digital signal processors, baseband processors, power management units, audio codec chips, application specific integrated circuits, etc.

If desired, device 10 may include input-output devices in addition to touch sensor 28. For example, circuitry 40 may include buttons, joysticks, click wheels, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through these input-output devices in addition to supplying touch input through an input-output device such as touch sensor 28 and may receive status information and other output from device 10 using the output resources of these input-output devices. The input-output resources of device 10 may, if desired, include one or more input-output connectors such as digital data connectors, analog signal connectors, connectors that handle power, analog signals, and/or digital data, or other input-output connectors. If desired, device cost and complexity can be minimized by omitting some or all of these additional input-output devices.

Figure 3:
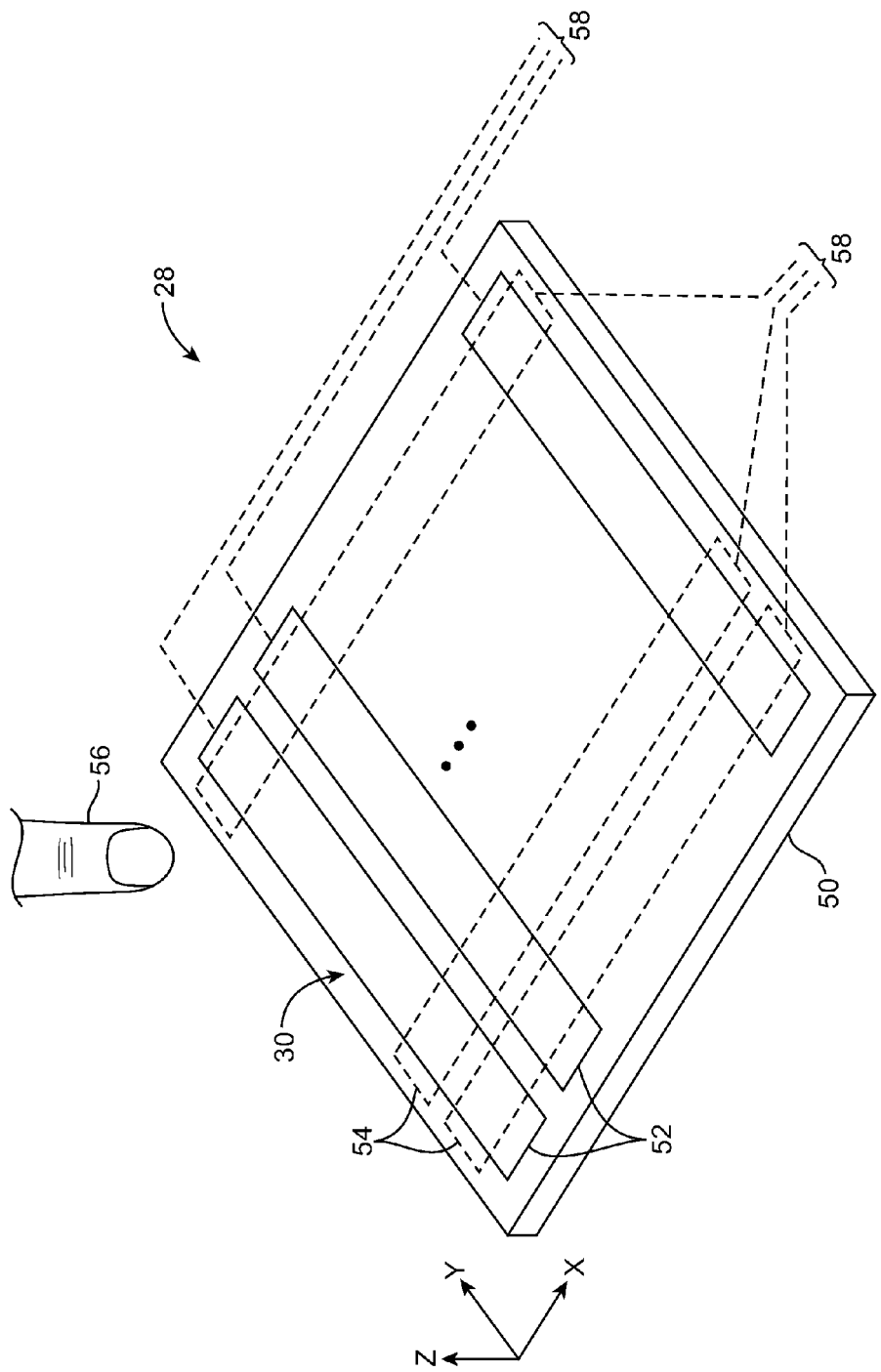
FIG. 3 is a perspective view of an illustrative two-sided touch sensor for a wireless input-output device in accordance with an embodiment.

Touch sensors such as touch sensor 28 may use electrodes 30 in a capacitive touch sensor arrangement such as the illustrative configuration of FIG. 3. As shown in FIG. 3, electrodes 30 may be formed on a substrate such as substrate 50. Substrate 50 may be a dielectric such as glass, ceramic, plastic, or other suitable material. If desired, substrate 50 may be shared with other structures in device 10 (e.g., solar cell structures, protective cover layer structures, housing structures, etc.). The configuration of FIG. 3 is merely illustrative.

Capacitive touch sensor electrodes 30 may have square shapes, diamond shapes, or other shapes that allow sensor 28 to determine the location of external object 56 relative to sensor 28 in lateral dimensions X and Y. In the example of FIG. 3, electrodes 30 include elongated rectangular upper surface electrodes 52 that run along lateral dimension Y on the upper surface of substrate 50 and elongated rectangular lower surface electrodes 54 that run along lateral dimension X on the lower surface of substrate 50 (i.e., electrodes 52 may run perpendicular to electrodes 54). Paths 58 may be used to supply drive signals to electrodes 52 and to gather corresponding sense signals from electrodes 54 (as an example). During operation, an external object such as external object 56 (i.e., one or more fingers of a user or a stylus) may be placed in the vicinity of the surface of touch sensor 28 (e.g., directly on sensor 28 or within a few millimeters or other suitable distance of the surface of sensor 28). Touch sensor processing circuitry 32 (FIG. 2) is used to determine the location of the touch event (i.e., the point of contact of object 56 in dimensions X and Y) based on signals from electrodes 30. Lateral position data (i.e., position information in lateral dimensions X and Y) may be used to control the location of a pointer or other icon on a display associated with device 22 or may otherwise be used as input to device 22.

Figure 4:
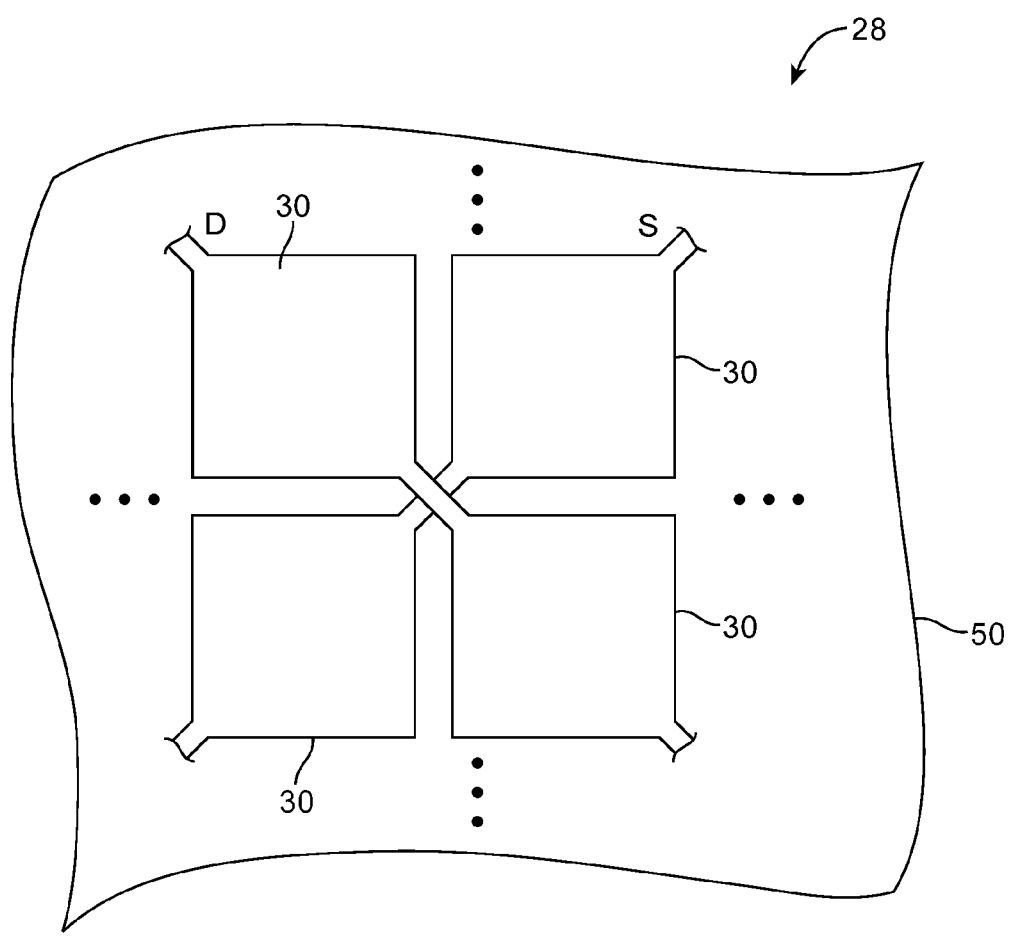
FIG. 4 is a top view of an illustrative pattern that may be used when implementing a one-sided touch sensor for a wireless input-output device in accordance with an embodiment.

If desired, touch sensor electrodes 30 may be formed on a single side of substrate 50. A portion of an illustrative one-sided touch sensor array is shown in FIG. 4. As shown in FIG. 4, touch sensor 28 may contain diagonally interconnected square electrodes 30 on a surface of substrate 50 some of which are used to carry drive signals D and some of which are used to gather corresponding sense signals S. When a user's finger or other external object is placed in the vicinity of electrodes 30 (e.g., in the vicinity of a pair of electrodes), sensor circuitry 32 can gather signal data that is converted into user touch input to be conveyed wirelessly to device 22. Electrodes 30 may be implemented using rectangular pads, narrow or thick lines of conductive material, diamond-shaped pads, meandering traces, or other suitable patterned conductor shapes.

Electrodes 30 for a two-sided touch sensor of the type shown in FIG. 3 or for a one-sided touch sensor of the type shown in FIG. 4 may be formed from conductive materials. In some arrangements, electrodes 30 may be formed from metals such as copper, aluminum, gold, etc. In other arrangements, electrodes 30 may be formed from transparent conductive material such as indium tin oxide or indium zinc oxide (e.g., a transparent semiconductor or other transparent conductive material).

Figure 5:
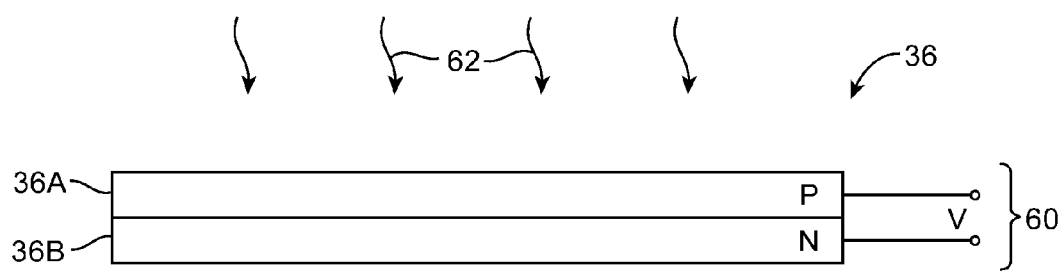
FIG. 5 is a cross-sectional side view of an illustrative solar cell of the type that may be used in powering a wireless input-output device in accordance with an embodiment.

Solar cell 36 is formed from semiconducting materials. A cross-sectional side view of solar cell 36 is shown in FIG. 5. As shown in FIG. 5, solar cell 36 may have multiple layers such as upper layer 36A and lower layer 36B. Additional layers (e.g., thin layers of metal, etc.) may also be included in solar cell 36. In the example of FIG. 5, layer 36A is a layer of p-type silicon and layer 36B is a layer of n-type silicon. Other semiconductors (e.g., other inorganic semiconductors and/or organic semiconductors) may be used, if desired. The semiconductor material that is used in forming solar cell 36 (i.e., layers such as layers 35A and 36B) may be formed from materials that are opaque in the visible spectrum and/or materials that are transparent (clear) in the visible spectrum (or that are sufficiently thin to be effectively transparent in the visible spectrum). The materials used in forming solar cell 36 may be transparent or opaque at infrared wavelengths.

During operation of solar cell 36, ambient light 62 (e.g., daylight and/or artificial light) is incident on solar cell 36 and produces an output voltage V across solar cells 60. Output voltage V can be used to power touch sensor 28, wireless circuitry 40, and other components in device 10 and can be used to store energy in energy storage 44 (FIG. 2). When ambient light levels are low, power can be provided by energy storage device 44 (e.g., instead of using solar power or to supplement power from solar cell 36).

Figure 6:
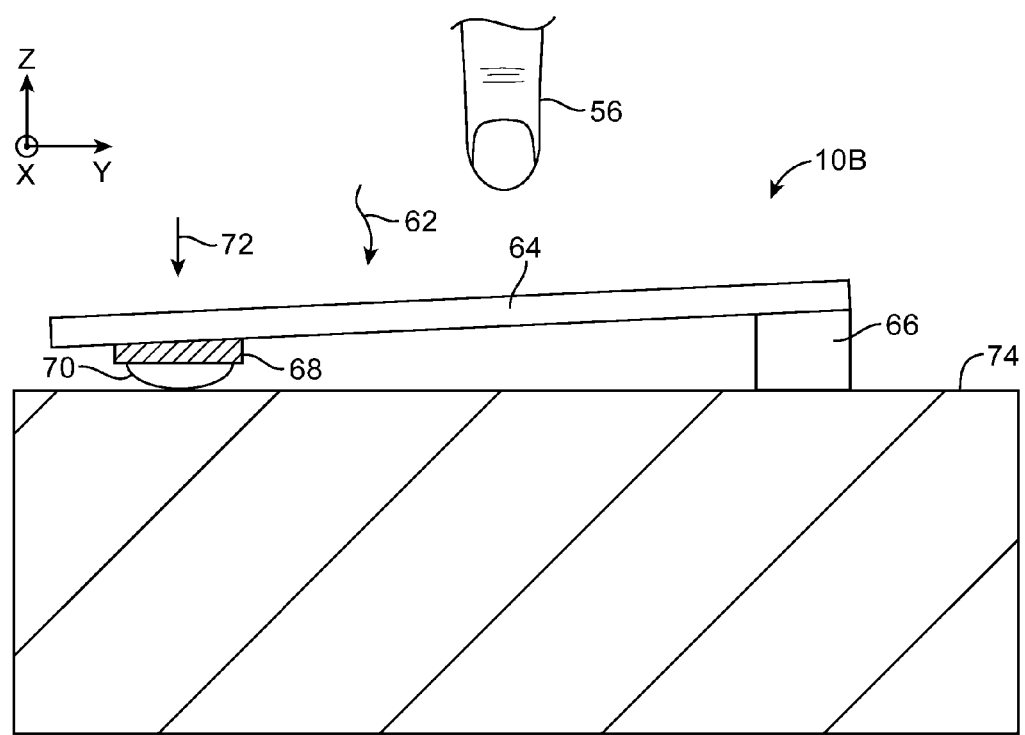
FIG. 6 is a cross-sectional side view of an illustrative wireless track pad of the type that may be powered using a solar cell in accordance with an embodiment.

A cross-sectional side view of an illustrative electronic device such as device 10B of FIG. 1 is shown in FIG. 6. Electronic device 10B may be a track pad. As shown in the cross-sectional side view of FIG. 6, track pad 10B may rest on a table or other support structure having support surface 74. Main touch sensor structure 64 (e.g., a planar member that lies in the X-Y plane of FIG. 6) may be supported using support legs such as legs 66 and 70. Legs such as legs 66 may be tall rear legs that tilt surface 64 towards a user. Solar cell 36 and touch sensor 28 may be mounted within structure 64.

Switch structures such as switch 68 or other force-sensitive components may be interposed within leg 70 or elsewhere in device 10B to monitor when a user has used finger 56 to press downwards on surface 64 in direction 72 (i.e., parallel to vertical axis Z). A user may, for example, position fingers such as finger 56 in X and Y, while touch sensor 28 in main structure 64 is gathering X-Y position data and may press downwards in direction 72 on structure 64 when it is desired to click on an on-screen option or to otherwise provide a "click" input. Ambient light 62 that is incident on structure 64 is converted into power by solar cell 36 in structure 64.

Figure 7:
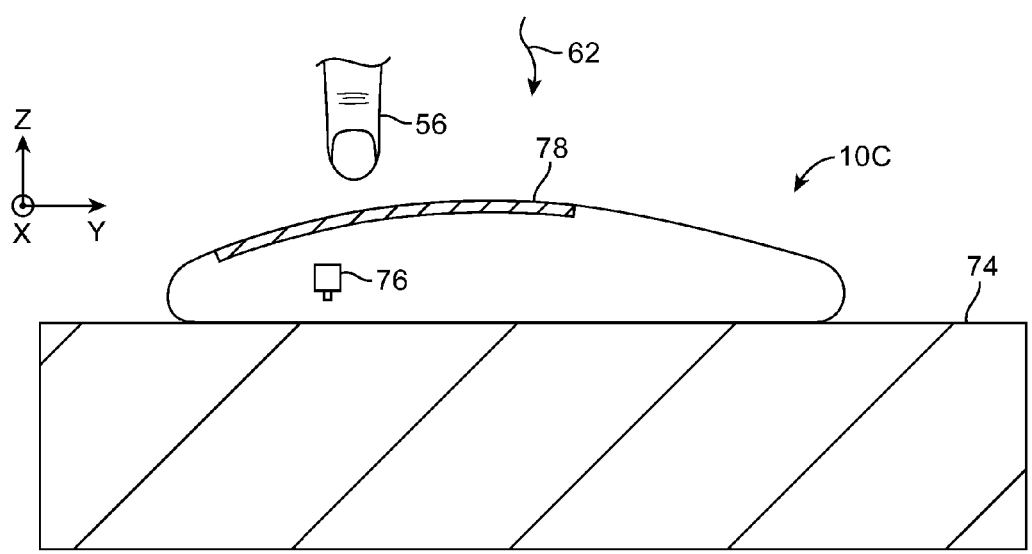
FIG. 7 is a cross-sectional side view of an illustrative wireless touch-sensitive mouse of the type that may be powered using a solar cell in accordance with an embodiment.

A cross-sectional side view of an illustrative electronic device such as device 10C of FIG. 1 is shown in FIG. 7. Electronic device 10C may be a computer mouse. As shown in the cross-sectional side view of FIG. 7, mouse 10C may rest on a table or other support structure having a surface such as support surface 74. Optical sensor 76 or other sensors may be used to gather information on the lateral movement of mouse 10C across surface 62 in the X-Y plane of FIG. 7. Touch sensor 28 may be mounted in a region such as region 78 along the upper surface of mouse 10C. Touch sensor 28 in mouse 10C may be used to gather location information for touch events (i.e., touch input associated with contact between external object 56 and the surface of device 10C). A user may supply single-finger and multi-finger gestures to mouse 10C using touch sensor 28. Solar cell 36 may be mounted within device 10C (e.g., in region 78, in a border surrounding region 78, or elsewhere) to generate power from ambient light 62. If desired, mouse 10C may include one or more buttons to receive click inputs in addition to or instead of gathering click (tap) inputs from touch sensor 28.

In configurations of the type shown in FIG. 6, input-output device 10 (e.g., track pad 10B) has a planar surface for gathering touch input with touch sensor 28. In configurations of the type shown in FIG. 7, input-output device 10 (e.g., computer mouse 10C) has a curved surface for gathering touch input with touch sensor 28. In forming devices with curved surfaces such as illustrative device 10C of FIG. 7, it may be desirable to form touch electrodes 30 and solar cell 36 using flexible substrates that can be bent to conform to the curved device surface or it may be desirable to form touch electrodes 30 and/or solar cell 36 by depositing layers of material (e.g., polysilicon for a solar cell and/or indium tin oxide or other materials for a touch sensor) onto a curved support structure, thereby forming touch sensor and solar cell structures with a curved shape. Arrangements using a combination of these approaches may also be used. For example, device 10 may be formed by bending touch and solar cell structures to accommodate attachment to a curved surface in device 10 and/or touch sensor and solar cell layers may be deposited on a curved substrate, thereby avoiding the need to bend separate touch and/or solar cell substrates into a desired shape. Configurations for device 10 that have flat surfaces are sometimes described as an example. These configurations are, however, merely illustrative. Device 10 may have a planar top surface, may have a curved top surface, or may have a housing that has planar and curved portions.

Figure 8:
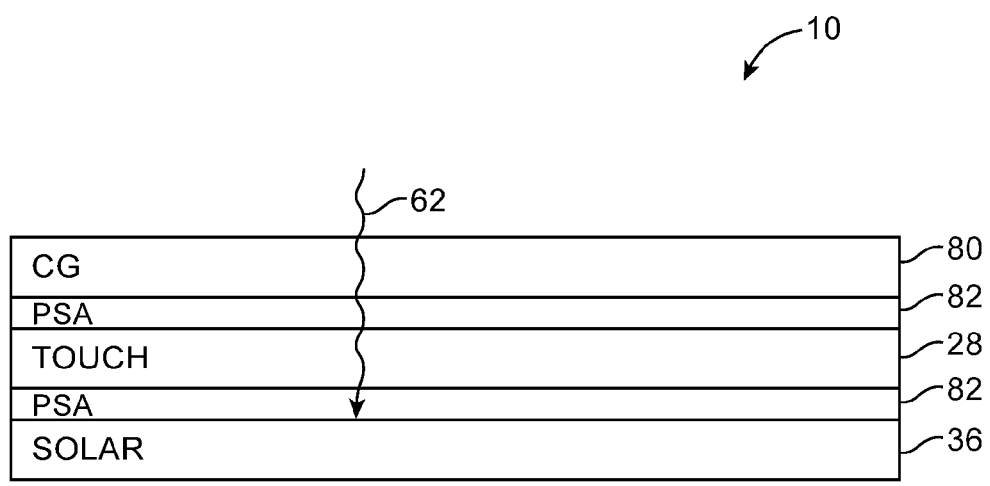
FIG. 8 is a cross-sectional side view of an illustrative stack-up in a wireless input-output device that includes a touch sensor above a solar cell in accordance with an embodiment.

A cross-sectional side view of an illustrative configuration for the touch sensor and solar cell structures that may be used in forming device 10 is shown in FIG. 8. As shown in FIG. 8, device 10 may have a clear cover layer such as cover layer 80. Cover layer 80 may be transparent so that ambient light 62 passes through cover layer 80. Cover layer 80 may be formed from a transparent structure such as a layer of transparent glass, a clear plastic layer, or other transparent material. Adhesive 82 (e.g., clear adhesive) such as liquid adhesive or pressure sensitive adhesive may be used to attach touch sensor 28 to the underside of cover layer 80 and to attach solar cell 36 to the underside of touch sensor 28. If desired, adhesive layers 82 may be omitted (e.g., in configurations in which the structures of cover layer 80, touch sensor 28, and solar cell 36 are formed by depositing layers of material on the underside of cover layer 80, in configurations in which layers are laminated together using heat and pressure in the absence of intervening adhesive, or in other configurations).

In the configuration of FIG. 8, touch sensor 28 is interposed between cover layer 80 and solar cell 36. Touch sensor 28 of FIG. 8 may be formed using transparent material for electrodes 30 and transparent material for substrate 50 (i.e., touch sensor 28 of FIG. 8 may be a transparent touch sensor). Transparent substrate 50 may be a layer of transparent plastic, a layer of transparent glass, or other clear material. Transparent electrodes 30 may be formed from clear conductive materials such as indium tin oxide or indium zinc oxide (as examples). As shown in FIG. 8, ambient light 62 passes through transparent touch sensor 28 and is absorbed by solar cell 36. Solar cell 36 may be formed from an opaque solar cell structure such as a silicon-based solar cell structure (as an example).

Figure 9:
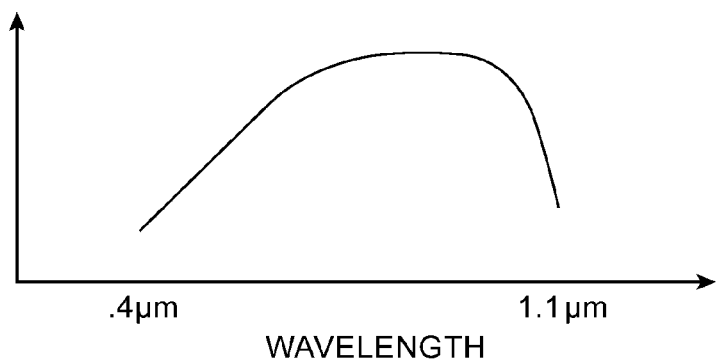
FIG. 9 is a graph showing an illustrative spectral response for a solar cell in accordance with an embodiment.

FIG. 9 is a graph in which the spectral response of a silicon solar cell has been plotted. As shown in FIG. 9, when solar cell 36 is implemented using silicon, the response of the solar cell extends from blue visible light (with a wavelength about equal to 0.4 microns) to near infrared light (with a wavelength about equal to 1.1 microns). It may be desirable to block solar cell 36 from view by a user. To block solar cell 36 from view, a layer of material such as ink or plastic that is opaque to visible light may be interposed between the user and solar cell 36. To allow solar cell 36 to receive sufficient ambient light 62 to produce electrical power, the visibly opaque material may be infrared-light transparent. For example, the visible-light-opaque material may be transparent at near infrared wavelengths above 0.7 microns (i.e., at the red end of the visible spectrum). By ensuring that the visible-light-opaque material is transparent in a suitable infrared wavelength range (e.g., 0.7 microns to 1.1 microns), a portion of ambient light 62 having infrared wavelengths (e.g., 0.7 microns to 1.1 microns) may be transmitted through the visible-light-blocking material to solar cell 36 to convert to electrical power. At the same time, the opacity of the visible-light-opaque material at visible wavelengths of 0.4 microns to 0.7 microns ensures that solar cell 36 will be blocked from view. If desired, the material that is used to hide solar cell 36 from view may have relatively narrow transmission windows at fluorescent light wavelengths (as shown in the graph of FIG. 11), thereby allowing solar cell 36 to be powered by indoor light fixtures while still being significantly opaque to viewers at visible light wavelengths.

Figure 10:
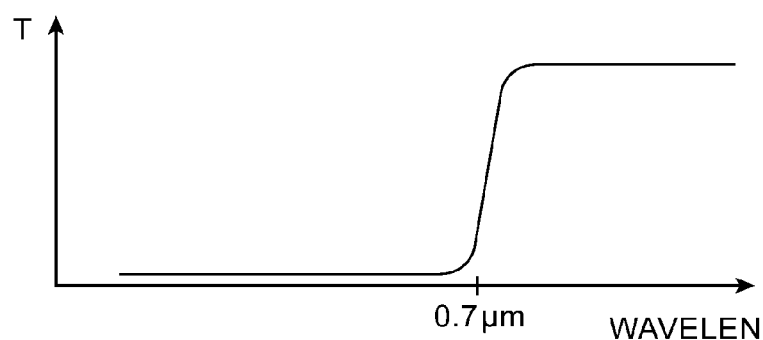
FIG. 10 is a graph of a transmission characteristic for an illustrative ink or other visible-light-blocking layer that may be used as a layer in a wireless input-output device in accordance with an embodiment.
Figure 11:
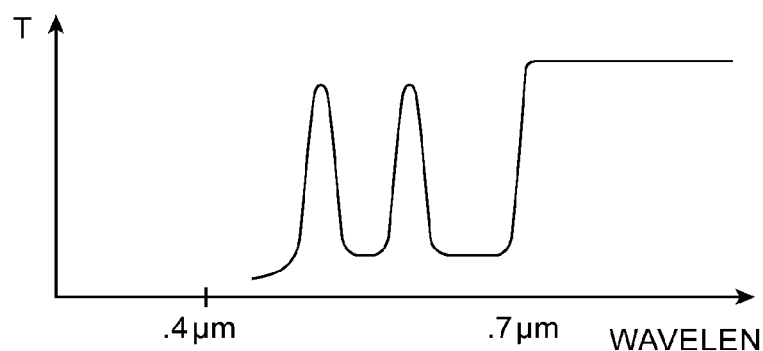
FIG. 11 is a graph of a transmission characteristic for an illustrative ink or other visible-light-blocking layer with fluorescent light transmission bands in accordance with an embodiment.
Figure 12:
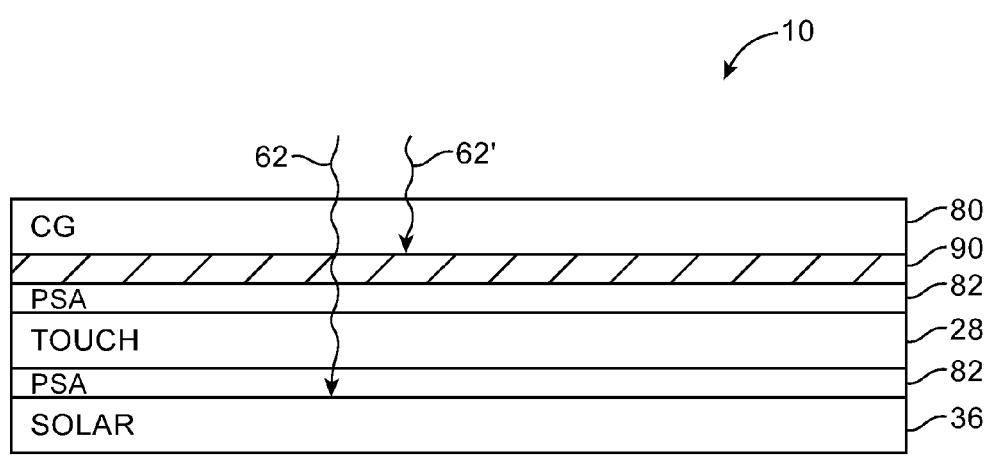
FIG. 12 is a cross-sectional side view of illustrative layers in a wireless input-output device with a touch sensor and solar cell in which a visible-light-blocking layer such as a layer of ink hides the touch sensor and solar cell from view in accordance with an embodiment.

FIG. 12 is a cross-sectional side view of device 10 in an illustrative configuration in which visible-light-blocking material 90 (e.g., ink or other material with a transmission characteristic of the type shown in FIG. 10 or FIG. 11) is interposed between cover layer 80 and touch sensor 28. Touch sensor 28 may be transparent so that light 62 (e.g., infrared light or fluorescent light that has passed through visible-light-blocking material 90) may reach solar cell 36. Broadband visible light 62' may be blocked by material 90. Material 90 may be, as an example, a layer of black ink deposited on the lower surface of cover layer 80 that is transparent at near infrared wavelengths (or at narrow fluorescent light wavelengths).

Figure 13:
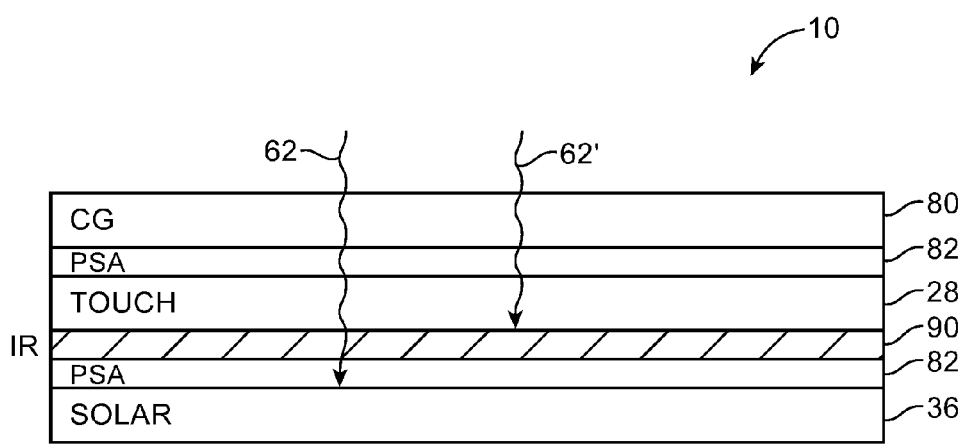
FIG. 13 is a cross-sectional side view of illustrative layers in a wireless input-output device with a touch sensor and solar cell in which a visible-light-blocking layer such as a layer of ink under a clear touch sensor is used to hide the solar cell in accordance with an embodiment.

In the illustrative configuration of FIG. 13, visible-light-blocking material 90 has been interposed between transparent touch sensor 28 and solar cell 36. Visible-light blocking material 90 preferably blocks visible light 62' while allowing ambient light 62 such as infrared light or fluorescent light to reach solar cell 36. With the arrangement of FIG. 12, material 90 blocks both touch sensor 28 and solar cell 36 from view by a user. With the arrangement of FIG. 13, material 90 blocks solar cell 36 from view, while transparent touch sensor 28 is invisible or nearly invisible to the viewer due to the use of transparent electrodes 30 and transparent substrate 50.

Figure 14:
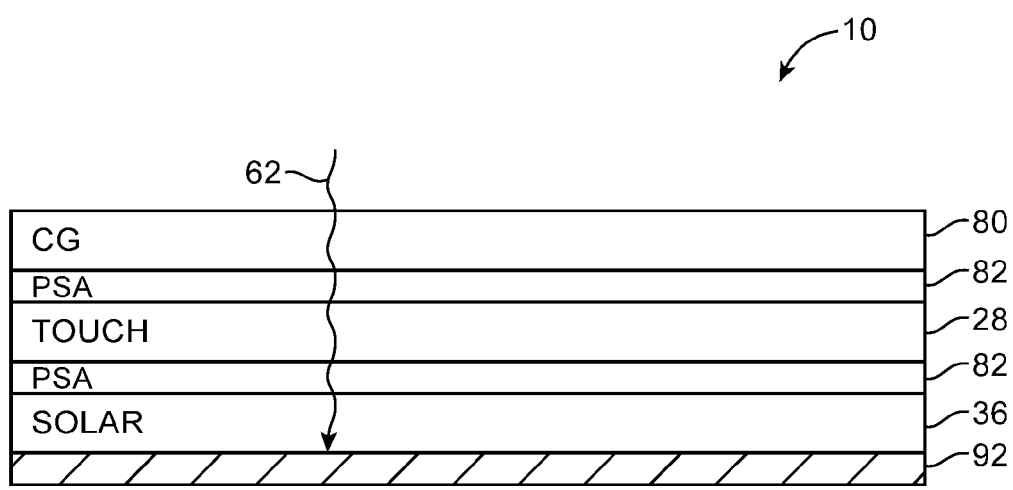
FIG. 14 is a cross-sectional side view of illustrative layers in a wireless input-output device with a touch sensor and solar cell in which ink or a layer of other light-blocking material is located under a clear touch sensor and a clear solar cell in accordance with an embodiment.

FIG. 14 is a cross-sectional side view of device 10 in an illustrative configuration in which both touch sensor 28 and solar cell 36 are transparent. A layer of material such as material 92 may be located below solar cell 36. Material 92 may be ink or other material that is deposited on the lower surface of solar cell 36, may be a separate structure formed from plastic, metal, or other material, or may be other structures visible through transparent touch sensor 28 and transparent solar cell 36. As an example, material 92 may be black ink, white ink, silver ink, gold ink, red ink, ink of other colors, or other light-blocking material. Material 92 may be deposited in a uniform film (i.e., material 92 may be a blanket layer of unpatterned ink) or material 92 may be patterned (e.g., to form a logo that is visible through the layers of device 10). Material 92 may be opaque to visible light and, if desired, may be opaque to infrared light.

Figure 15:
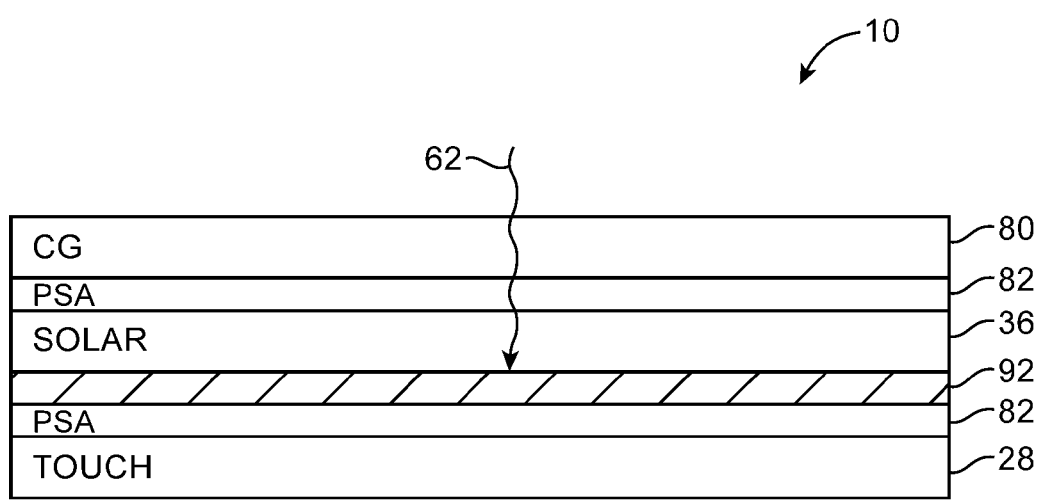
FIG. 15 is a cross-sectional side view of illustrative layers in a wireless input-output device with a touch sensor and solar cell in which a light-blocking layer of material such as a layer of ink under a clear solar cell is used to hide a touch sensor in accordance with an embodiment.

In the illustrative configuration of FIG. 15, solar cell 36 is interposed between touch sensor 28 and cover layer 80. Because solar cell 36 lies above touch sensor 28, it may be desirable to configure solar cell 36 to minimize electrical shielding effects, thereby allowing the capacitive electrodes of touch sensor 28 to gather touch data without being impeded by the presence of solar cell 36. With one suitable arrangement, solar cell 36 is patterned so that the conductive layers of cell 36 have a pattern that minimizes interference with touch sensor 28 (e.g., solar cell 36 may be formed from a pattern with floating strips of solar cell material, each overlapping a respective elongated rectangular touch electrode such as electrodes 52 of FIG. 3, solar cell 36 may be formed from electrically floating squares of solar cell material, etc.).

Solar cell 36 of FIG. 15 may be a transparent or opaque solar cell. If solar cell 36 is opaque, light 62 will be absorbed in solar cell 36. The appearance of device 10 will therefore be determined by the appearance of solar cell 36. In this type of situation, it may be desirable to form solar cell 36 from a blanket film of polysilicon or other semiconductor structures having a uniform appearance.

Touch sensor 28 of FIG. 15 may be a transparent touch sensor or an opaque touch sensor. Material 92 may be interposed between solar cell 36 and touch sensor 28. In arrangements in which solar cell 36 is transparent, the appearance of device 10 of FIG. 15 will be controlled by the appearance of material 92. For example, if material 92 is silver ink, device 10 will appear silver.

Figure 16:
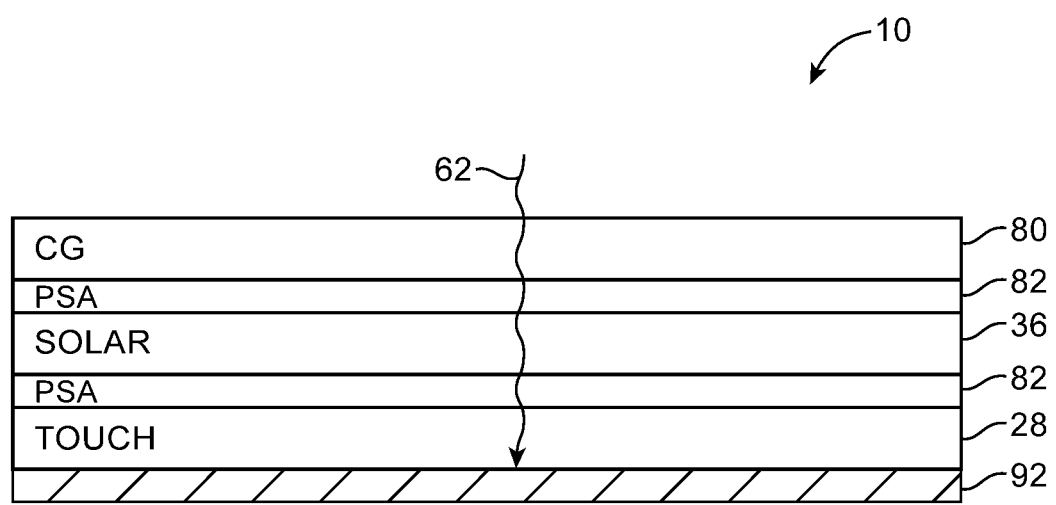
FIG. 16 is a cross-sectional side view of illustrative layers in a wireless input-output device with a touch sensor and solar cell in which a clear touch sensor is located under a clear solar cell and in which a layer of light-blocking material such as a layer of ink is located under the clear touch sensor in accordance with an embodiment.

FIG. 16 shows how visible-light-blocking material 92 may be formed below touch sensor 28 in configurations in which both solar cell 36 and touch sensor 28 are transparent. Solar cell 36 is located above touch sensor 28, so the intensity of light 62 reaching solar cell 36 is not diminished due to the presence of touch sensor 28. Solar cell 36 and touch sensor 28 are clear, so the appearance of device 10 can be controlled by appropriate selection of the appearance of layer 92. For example, if layer 92 is formed from silver ink, the silver color of the silver ink will be visible through transparent solar cell 36 and transparent touch sensor 28.

Figure 17:
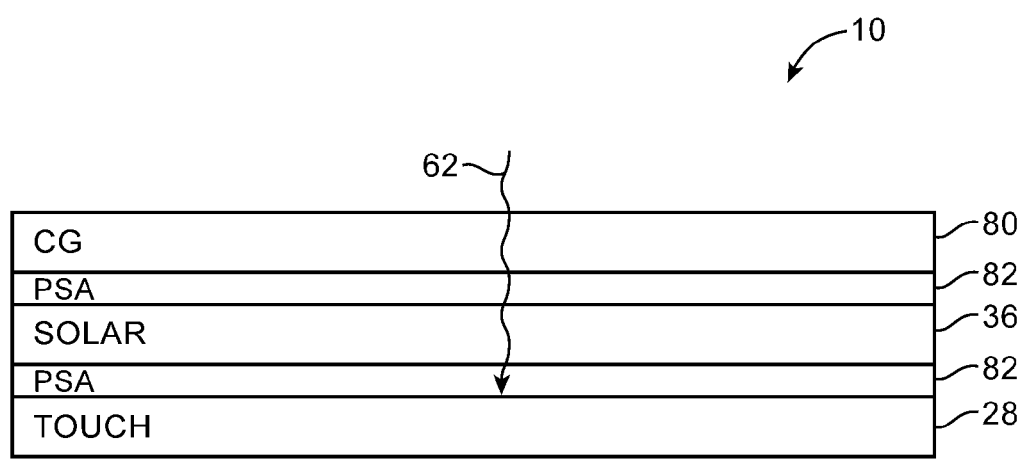
FIG. 17 is a cross-sectional side view of illustrative layers in a wireless input-output device with a touch sensor and solar cell in which an opaque touch sensor is located under a clear solar cell in accordance with an embodiment.

If touch sensor 28 is opaque and has a satisfactory appearance, solar cell 36 may be transparent and may be interposed between touch sensor 28 and cover layer 80, as shown in FIG. 17. With the arrangement of FIG. 17, the appearance of device 10 is determined by the appearance of touch sensor 28, which is opaque (in this example).

Figure 18:
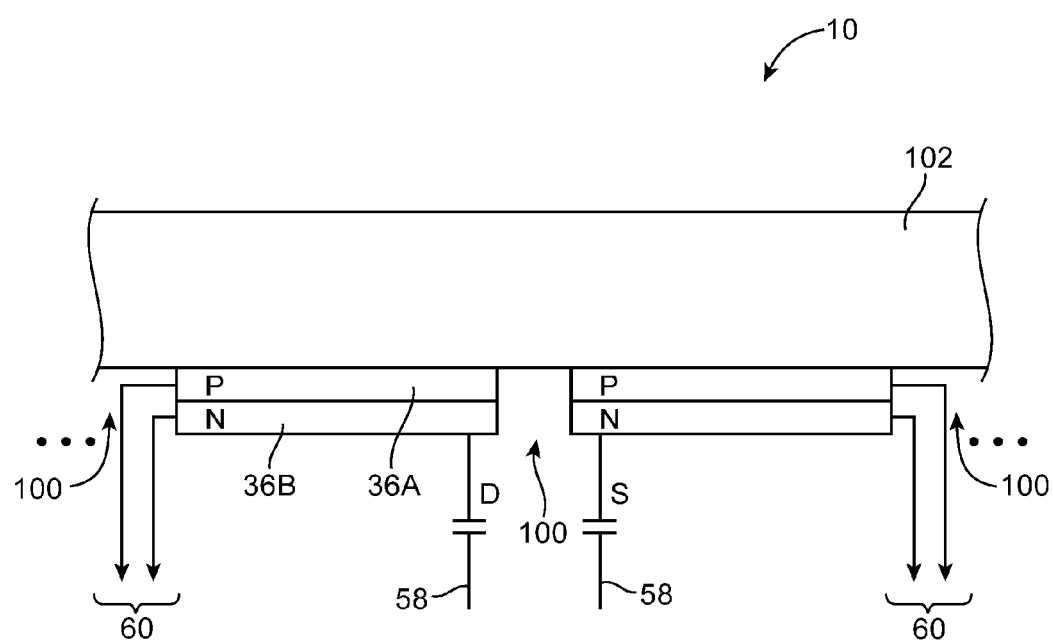
FIG. 18 is a cross-sectional side view of illustrative layers in a wireless input-output device with a touch sensor and solar cell formed from shared structures such as a patterned layer of material on a substrate in accordance with an embodiment.

If desired, solar cell structures for solar cell 36 such as semiconductor layers 36A and 36B of FIG. Sand touch sensor structures for touch sensor 28 such as electrodes 30 of FIG. 4 may be formed from one or more shared layers of material. FIG. 18 is a cross-sectional side view of device 10 in an illustrative configuration in which a layer of patterned material is formed on the bottom of a transparent substrate layer 102. Layer 102, which may be formed from clear glass, transparent plastic, or other transparent material, may be the outermost layer of device 10 (e.g., a layer such as cover layer 80) or may be covered with one or more other layers of structures.

As shown in FIG. 18, the patterned layer of material on the lower surface of substrate 102 may include sublayers such as layers 36A and 36B. Layers 36A and 36B may be p-type and n-type doped semiconductor layers that are layered on top of each other and connected to terminals 60 to serve as solar cell structures for solar cell 36. The layer of material containing layers 36A and 36B is patterned to create gaps 100 (i.e., gaps filled with plastic, air, or other dielectric). Gaps 100 electrically isolate areas of the layer of material on the underside of layer 102. These electrically isolated areas of material can have square shapes or other suitable shapes that allows the isolated areas to serve as touch sensor electrodes 30.

The isolated areas of material (i.e., the square sections containing layers 36A and 36B) may be coupled to touch sensor signal lines 58 and may be diagonally interconnected to form drive lines D and sense lines S for touch sensor 28, as shown in the illustrative electrode pattern of FIG. 4. Other electrode patterns may be used if desired (e.g., elongated rectangular patterns, etc.). Capacitors may be interposed in lines 58 to block direct-current (DC) solar cell signals and thereby prevent these DC signals from reaching touch sensor processing circuitry 32, while allowing touch signals associated with touch sensor processing circuitry 32 to pass.

In the configuration of FIG. 18, shared solar cell and touch sensor electrode structures are patterned in a single layer on the bottom of substrate 102. If desired, two-sided configurations may be used in which some structures (e.g., solar cell structures, touch sensor electrodes, or structures that serve both as touch sensor electrodes and solar cell structures) are formed on the upper surface of a substrate and in which other structures (e.g., solar cell structures, touch sensor electrodes, or structures that serve both as touch sensor electrodes and solar cell structures) are formed on an opposing lower surface of the substrate. Single-sided and two-sided substrates that incorporate shared touch sensor electrode and solar cell structures may also be formed in layers that are attached to one or more separate touch sensor layers and/or solar cell layers.

Figure 19:
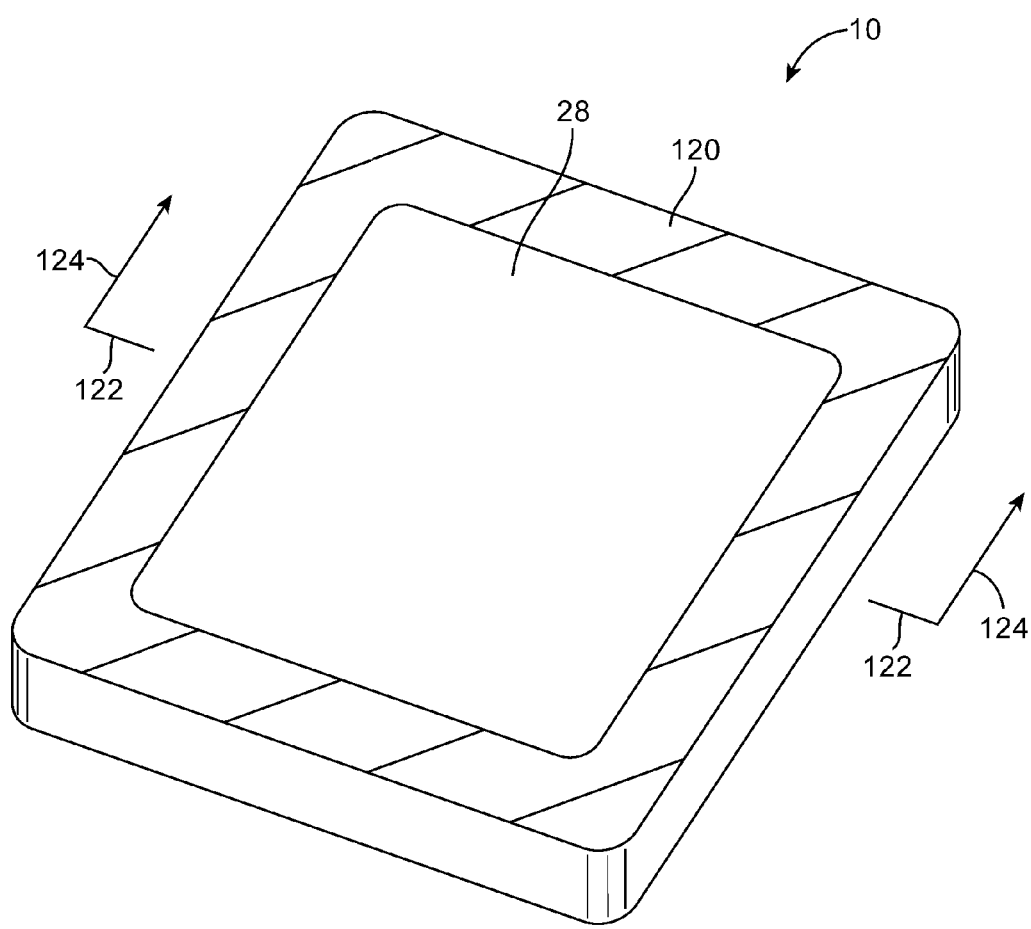
FIG. 19 is a perspective view of an illustrative wireless input-output device such as a track pad in accordance with an embodiment.

A solar cell can be formed in a border region of device 10. A perspective view of an illustrative configuration for device 10 in which a rectangular touch sensor array (touch sensor 28) has been surrounded by a rectangular ring-shaped border (border 150) is shown in FIG. 19. One or more solar cells may be formed in border 120 in addition to or instead of forming solar cell 36 in the center of device 10 overlapping the rectangular touch sensor array. Border 120 may be devoid of touch sensor electrodes (i.e., border 150 may be insensitive to touch) or border 120 may contain touch sensor electrodes (i.e., touch sensor electrodes 30 may extend across the surface of device 10). In arrangements in which border 120 contains touch sensor electrodes, the touch sensor electrodes may be clear to permit light to reach underlying solar cell structures or solar cell 36 may be formed on top of the touch sensor electrodes. Illustrative stacking configurations for accommodating both touch sensor electrodes and solar cell 36 in border 120 are described in connection with FIGS. 8-18.

Figure 20:
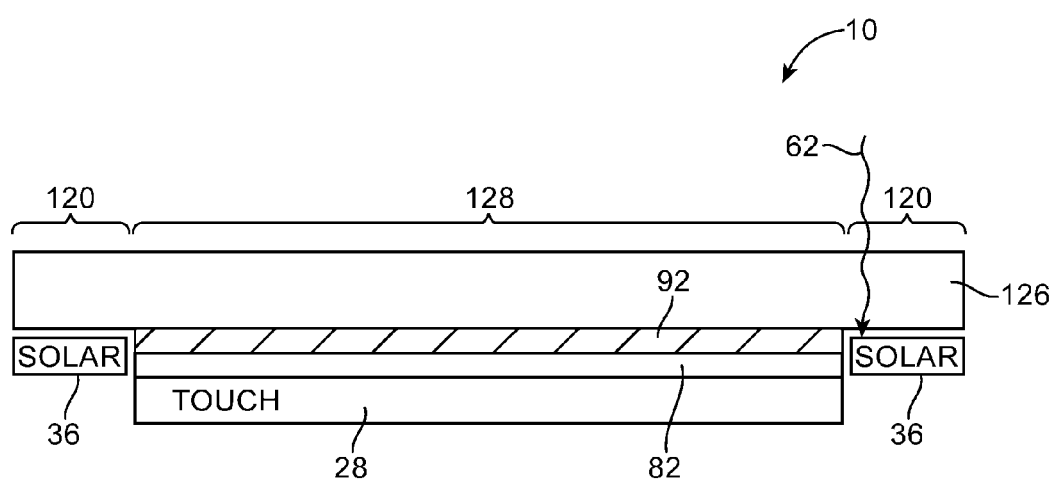
FIG. 20 is a cross-sectional side view of illustrative layers in a wireless input-output device with a touch sensor that is surrounded by an inactive border region containing a solar cell such as the input-output device of FIG. 19 in accordance with an embodiment.

FIG. 20 is a cross-sectional side view of device 10 of FIG. 19 taken along line 122 and viewed in direction 124 in a configuration in which border 120 is free of touch sensor electrodes 30 for touch sensor 28. As shown in FIG. 20, touch sensor 28 may lie under central rectangular region 128 of substrate 126. Region 128 may be free of solar cell structures (as shown in FIG. 20) or may include solar cell structures.

Substrate 126 may be a layer of clear glass, transparent plastic, or other structure that allows light 62 to reach solar cell 36 in border 120 (e.g., a cover layer such as cover layer 80 or an internal substrate layer in device 10). In configurations in which central region 128 is free of solar cells structures, light-blocking layer 92 (e.g., a layer of black ink, silver ink, ink of other colors, or other opaque material) may be used to block touch sensor 28 from view. In region 120, solar cell 36 may be uncovered by light-blocking structures or a layer of ink that blocks visible light while passing infrared light (or narrow fluorescent light wavelengths) can be used to cover solar cell 36 so that solar cell 36 receives light 62 while simultaneously blocking solar cell 36 from view.

The foregoing is merely illustrative and various modifications can be made by those skilled in the art without departing from the scope and spirit of the described embodiments. The foregoing embodiments may be implemented individually or in any combination.

What is claimed is:

1. A wireless electronic device that supplies user touch input to external wireless electronic equipment, comprising:
    a touch sensor that receives the user touch input from an external object;
    a solar cell that converts ambient light into electrical power;
    wireless communications circuitry that uses the electrical power from the solar cell to transmit the user touch input to the external wireless electronic equipment, wherein the touch sensor has a rectangular shape and wherein the solar cell is located within a rectangular ring-shaped border that surrounds the touch sensor;
    a transparent cover layer that overlaps the touch sensor and the rectangular ring-shaped border; and
    a layer of visible-light-blocking material that is coated on an underside of the transparent cover layer and that overlaps the touch sensor, wherein the solar cell wraps around the layer of visible-light-blocking material within the rectangular ring-shaped border.

2. The wireless electronic device defined in claim 1 wherein the external wireless electronic equipment comprises a computer, wherein the wireless electronic device comprises a wireless track pad, and wherein the touch sensor comprises an array of capacitive touch sensor electrodes.

3. The wireless electronic device defined in claim 1, wherein the layer of visible-light-blocking material is unpatterned.

4. The wireless electronic device defined in claim 1, wherein the layer of visible-light-blocking material is a uniform film.

5. The wireless electronic device of claim 1 further comprising a layer of adhesive between the touch sensor and the layer of visible-light-blocking material.

6. The wireless electronic device defined in claim 1 wherein the touch sensor comprises transparent capacitive touch sensor electrodes.

7. The wireless electronic device defined in claim 1 wherein the solar cell comprises a transparent solar cell.

8. The wireless electronic device defined in claim 1 wherein the touch sensor comprises a transparent touch sensor.

9. The wireless electronic device defined in claim 1 wherein the touch sensor comprises a transparent touch sensor and wherein the solar cell comprises a transparent solar cell.

* * * * *